US011831800B2

(12) United States Patent
Kim et al.

(10) Patent No.: US 11,831,800 B2
(45) Date of Patent: Nov. 28, 2023

(54) ACCESSORY-RECOGNIZING ELECTRONIC DEVICE

(71) Applicant: Samsung Electronics Co., Ltd., Gyeonggi-do (KR)

(72) Inventors: Junghan Kim, Gyeonggi-do (KR); Bonseok Ku, Gyeonggi-do (KR); Youngpil Kim, Gyeonggi-do (KR); Kunhak Lee, Gyeonggi-do (KR); Baeseok Lim, Gyeonggi-do (KR); Hyoseok Na, Gyeonggi-do (KR); Changryong Heo, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 131 days.

(21) Appl. No.: 17/483,978

(22) Filed: Sep. 24, 2021

(65) Prior Publication Data

US 2022/0014615 A1 Jan. 13, 2022

Related U.S. Application Data

(63) Continuation of application No. PCT/KR2020/004010, filed on Mar. 24, 2020.

(30) Foreign Application Priority Data

Apr. 16, 2019 (KR) .......................... 10-2019-0044235

(51) Int. Cl.
*H04M 1/02* (2006.01)
*H04M 1/7246* (2021.01)
(Continued)

(52) U.S. Cl.
CPC ....... *H04M 1/7246* (2021.01); *H04M 1/0254* (2013.01); *H04M 1/72412* (2021.01); *H04R 5/02* (2013.01)

(58) Field of Classification Search
CPC ........... H04M 1/72412; H04M 1/7246; H04M 1/0254; H04M 1/02; H04R 5/02
See application file for complete search history.

(56) References Cited

U.S. PATENT DOCUMENTS 9,735,825 B2 8/2017 Lee et al.
9,876,893 B2 1/2018 Yoo et al.
(Continued)

FOREIGN PATENT DOCUMENTS

KR 10-2015-0022159 A 3/2015
KR 10-2015-0103955 A 9/2015
(Continued)

*Primary Examiner* — Tuan H Nguyen
(74) *Attorney, Agent, or Firm* — Cha & Reiter, LLC

(57) ABSTRACT

An accessory-recognizing electronic device according to an embodiment of the present invention comprises: a housing; at least one metal plate disposed within the housing; at least one magnetic force detection sensor disposed on the bottom of the at least one metal plate; a memory; and a processor operatively connected to the at least one magnetic force detection sensor and the memory, wherein the processor recognizes attachment of the at least one accessory to the designated area of the housing on the basis of the strength and polarity of a magnetic force detected by the at least one magnetic force detection sensor, the at least one accessory including at least one magnet inside the at least one accessory, and determines properties of the attached at least one accessory corresponding to the detected strength and polarity of the magnetic force, by using information stored in the memory.

15 Claims, 10 Drawing Sheets

(51) Int. Cl.
*H04M 1/72412* (2021.01)
*H04R 5/02* (2006.01)

(56) References Cited

U.S. PATENT DOCUMENTS

| | | |
|---|---|---|
| 10,056,933 B2 | 8/2018 | Lee et al. |
| 10,379,625 B2 | 8/2019 | Kwon et al. |
| 10,484,526 B2 | 11/2019 | Lee et al. |
| 10,580,556 B2 | 3/2020 | Lauder et al. |
| 10,707,912 B2 | 7/2020 | Kim et al. |
| 10,916,363 B2 | 2/2021 | Lauder et al. |
| 2017/0026069 A1* | 1/2017 | Kim .................... H04M 1/0254 |
| 2017/0285842 A1* | 10/2017 | Kim ..................... G06F 3/0412 |
| 2018/0012691 A1 | 1/2018 | Lauder et al. |

FOREIGN PATENT DOCUMENTS

| | | |
|---|---|---|
| KR | 10-2017-0083457 A | 7/2017 |
| KR | 10-2017-0114420 A | 10/2017 |
| KR | 10-2018-0091596 A | 8/2018 |
| KR | 10-2018-0111385 A | 10/2018 |

* cited by examiner

ACCESSORY-RECOGNIZING ELECTRONIC DEVICE

CROSS-REFERENCE TO RELATED APPLICATION(S)

This application is a continuation of International Application No. PCT/KR2020/004010, filed on Mar. 24, 2020, which claims priority to Korean Patent Application No. 10-2019-0044235 filed on Apr. 16, 2019, in the Korean Intellectual Property Office, the disclosures of which are herein incorporated by reference.

TECHNICAL FIELD

Certain embodiments disclosed in the disclosure relate to technology for detection of an attached accessory.

BACKGROUND ART

As electronic devices equipped with independent operating systems are becoming widespread, the electronic devices provide functions or services pursuing interaction with a user. For example, when an accessory selected by the user is attached to a specified region of the electronic device, the electronic device should recognize the accessory and provide functionality in conjunction with the accessory.

Using short-range wireless communication to scan a tag signal transmitted from the accessory can have a number of limitations. For example, such an accessory recognition method requires provision of a radio channel and a communication resource (e.g., an antenna or an IC chip) for receiving the tag signal on the electronic device, thereby increasing a manufacturing cost of the electronic device. Furthermore, short-range wireless communication can consume power for the transmission signal, thus necessitating a battery in the accessory. When the communication between the electronic device and the accessory is disrupted, either by interference, or a noisy transmission environment, recognition reliability of the accessory attached to or in the proximity of the electronic device may be reduced.

Certain embodiments disclosed in the disclosure may provide an electronic device that recognizes an accessory, which may reliably recognize attachment of an accessory. The electronic device can then provide a function or a service related to the attached accessory.

SUMMARY OF INVENTION

An electronic device according to an embodiment may include a housing, at least one metal plate disposed inside the housing, at least one magnetic force detecting sensor disposed below the at least one metal plate, a memory, and a processor operatively connected to the at least one magnetic force detecting sensor and the memory.

According to an embodiment, the processor may recognize attachment of at least one accessory to a specified region of the housing based on an intensity of a magnetic force and a polarity sensed by the at least one magnetic force detecting sensor, the at least one accessory including at least one magnet inside the at least one accessory, and determine an attribute of the attached at least one accessory corresponding to the sensed intensity of the magnetic force and the polarity using information stored in the memory.

An electronic device according to an embodiment may include a housing, at least one touch sensor disposed inside the housing, a memory, and a processor operatively connected to the at least one touch sensor and the memory.

According to an embodiment, the processor may recognize attachment of at least one accessory to a specified region of the housing based on a touch area and a touch intensity sensed by the at least one touch sensor, the at least one accessory including at least one magnet inside the at least one accessory, and determine an attribute of the attached at least one accessory corresponding to the sensed touch area and touch intensity using information stored in the memory.

According to certain embodiments, a platform capable of reducing a manufacturing cost of an electronic device and recognizing an accessory attached to the electronic device may be provided.

According to certain embodiments, as a function or a service of an electronic device corresponding to a recognized attribute of an accessory is provided, a variety of user experiences may be supported.

In addition, various effects that are directly or indirectly identified through the disclosure may be provided.

DESCRIPTION OF DRAWINGS

With regard to description of drawings, the same or similar components may be specified by the same or similar reference numerals.

DETAILED DESCRIPTION

Figure 1:
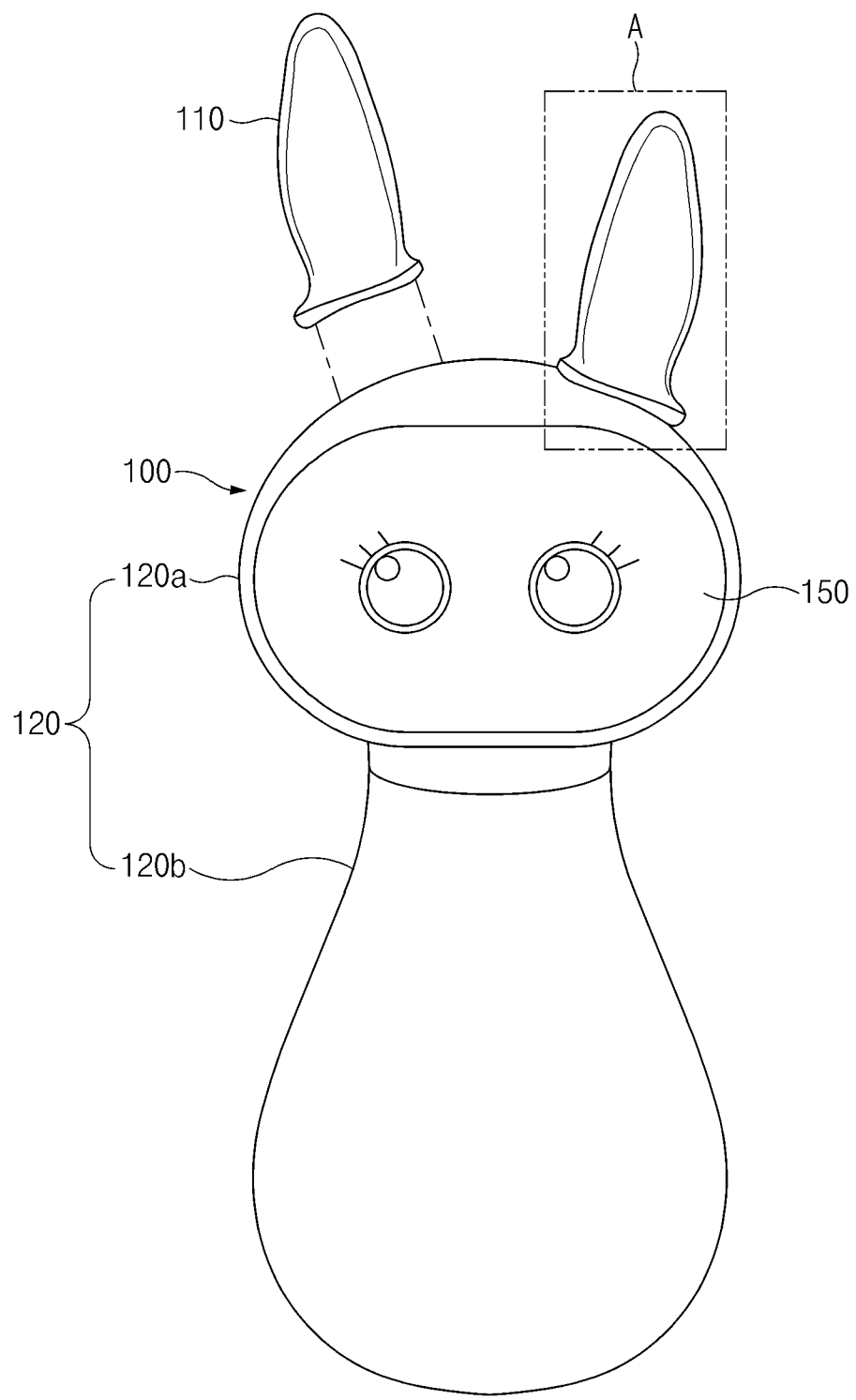
FIG. 1 is a diagram showing an example of operation of an electronic device according to an embodiment.

Hereinafter, various example embodiments of the disclosure will be described in greater detail with reference to the accompanying drawings. However, it should be understood that the disclosure is not limited to specific embodiments, but rather includes various modifications, equivalents and/or alternatives of the embodiments of the present disclosure. Regarding description of the drawings, like reference numerals may refer to like elements.

FIG. 1 is a diagram showing an example of operation of an electronic device according to an embodiment.

The electronic device 100 can detect attachment of an accessory 110 by based on the intensity of a magnetic force and polarity from magnet(s) in the accessory 110. Based on the intensity of the magnetic force and the polarity, an attribute of the accessory 110 can be determined. The intensity and polarity of the magnetic force can be sensed by magnetic force detecting sensor(s) that provide measurements to a processor. The processor determines the attribute of the attached accessory 110 by accessing a memory. The memory includes a table or other data structure having that associates attribute information with different magnetic forces quantities and polarities. Accordingly, the processor can determine the attribute information by determining the attribute information that is associated with the magnetic intensity and polarity received from the magnetic force detecting sensor(s). Based on the attribute information, the processor can determine a function or service.

Referring to FIG. 1, an electronic device 100 according to an embodiment. The electronic device 100 may provide built-in functions or services based on an accessory 110. The accessory 110 can be configured to be in association with the electronic device 100 and detachably attached to a specified region of the electronic device 100. For example, the electronic device 100 may determine an attribute of the accessory 110 attached to the specified region. In response to determining the attribute, electronic device 100 may provide a function or a service corresponding to the attribute of the accessory 110. In one embodiment, the attribute of the accessory 110 may include at least one of a type, a model, a version, a design, a symbol, and identification information of the accessory 110.

The electronic device described through FIG. 1 and other drawings below may include a wide variety of devices that operate electronically. In certain embodiments, the electronic device can comprise an artificial intelligence system that may simulate human-level intelligence by performing logical determination and interference on characteristics of input data based on a machine learning (e.g., deep learning) algorithm. However, the electronic device is not limited to the foregoing. In other embodiments, the electronic device can be a toy that reproduces voice recordings to the user.

In one embodiment, the accessory 110 may include a plurality of accessories 110. Some of the plurality of accessories 110 may have an attribute different from that of others. For example, the plurality of accessories 110 may include some accessories 110 having the same attribute, and some accessories 110 having different attributes. According to an embodiment, the accessory 110, from among the plurality of possible accessories 110, that is attached may be understood as the accessory 110 selected by a user to perform the function or the service of the electronic device 100 related to the corresponding accessory 110.

In one embodiment, the specified region of the electronic device 100 may be a region of a housing 120 that forms at least a portion of an exterior of the electronic device 100. In FIG. 1, the housing 120 may include a first housing 120a (constituting a head of the electronic device 100), and a second housing 120b (constituting a body of the electronic device 100). The first housing 120a and the second housing 120b may be integrally formed, or may be detachably coupled to each other. According to an embodiment, at least one of the first housing 120a and the second housing 120b may include an interface corresponding to the attachment region of the accessory 110. The interface may, for example, be formed to be at least partially different from a peripheral portion to guide the attachment of the accessory 110. For example, the interface may be engraved and have a depth. Alternatively, the interface may be indicated in a specified color or as a line having a specified shape (e.g., a circular shape or an oval shape) without a difference in depth from the peripheral portion. In certain embodiments, the housing 120 and the plurality of accessories 110 may contain the same or similar material. For example, the housing 120 and the plurality of accessories 110 may contain a material (e.g., silicon) that is at least partially flexible to minimize damage resulted from mutual detachment.

In one embodiment, the attachment of the accessory 110 to the interface defined in the housing 120 (e.g., the first housing 120a and/or the second housing 120b) may be based on magnetism. In this regard, each of the plurality of accessories 110 may include at least one magnet therein, and the electronic device 100 may support the attachment of the accessory 110 by including a structure for forming an attractive force with the at least one magnet inside the housing 120.

According to an embodiment, at least one of a quantity, a placement position, a polarity, and a magnetic force strength of the at least one magnet included in the accessory 110 may be different for sets of accessories 110. In other words, the quantity, the placement position, the polarity, and the magnetic force strength of the at least one magnet included in each set of accessories 110 having the same attribute are the same, but at least one of the quantity, the placement position, the polarity, and the magnetic force strength of the included magnet 111 may be different between the set of accessories 110 and another accessory 110 (or another set of accessories 110). Based on this, the electronic device 100 may sense the polarity and the magnetic force strength for the accessory 110 attached to the interface of the housing 120 (or for the at least one magnet included in the accessory 110), and determine the attribute of the accessory 110 based on at least one of the sensed polarity and magnetic force strength.

According to another embodiment, the accessory 110 may further include a dielectric therein, in addition to the at least one magnet. For example, at least one of a dielectric permittivity and a size (or an area) of the dielectric may be different for the sets of accessories 110. Based on this, the electronic device 100 may sense a touch area based on the dielectric size and a touch sensitivity based on the dielectric permittivity of the accessory 110 attached to the interface of the housing 120, and determine the attribute of the corresponding accessory 110 based on at least one of the sensed touch area and touch sensitivity.

In one embodiment, the interface of the housing 120 may be a plurality of interfaces. For example, the plurality of interfaces may be defined in the first housing 120a or the second housing 120b, or some of interfaces may be defined in the first housing 120a and the others may be defined in the second housing 120b. According to an embodiment, when the polarity and the magnetic force strength of the plurality of accessories 110 respectively attached to the plurality of interfaces are the same, the electronic device 100 may determine the plurality of accessories 110 as the set of accessories 110 having the same attribute, and may provide a function or a service corresponding to the attribute of the plurality of accessories 110.

Correspondingly, when the polarity and the magnetic force strength of the plurality of accessories 110 respectively attached to the plurality of interfaces are not the same, the electronic device 100 may not provide a separate function or service by determining that the plurality of accessories 110 have different attributes.

In one embodiment, the electronic device 100 may control output of a display 150 exposed through at least a portion of the housing 120 (e.g., the first housing 120a or the second housing 120b) as at least a portion of the function or service provision. For example, the electronic device 100 may control the display 150 to output a user interface including a scenario or a theme corresponding to the determined attribute of the accessory 110. As another example, the electronic device 100 may control the display 150 to output a persona (e.g., an animal image or an animal video) corresponding to the determined attribute of the accessory 110. In another embodiment, the electronic device 100 may control at least one mounted speaker (not shown) to output a sound (e.g., an animal sound) corresponding to the determined attribute of the accessory 110.

Hereinafter, an embodiment related to recognition of the accessory 110 of the electronic device 100 and structures of the electronic device 100 and the accessory 110 implementing the same will be described with reference to the drawings.

Figure 2:
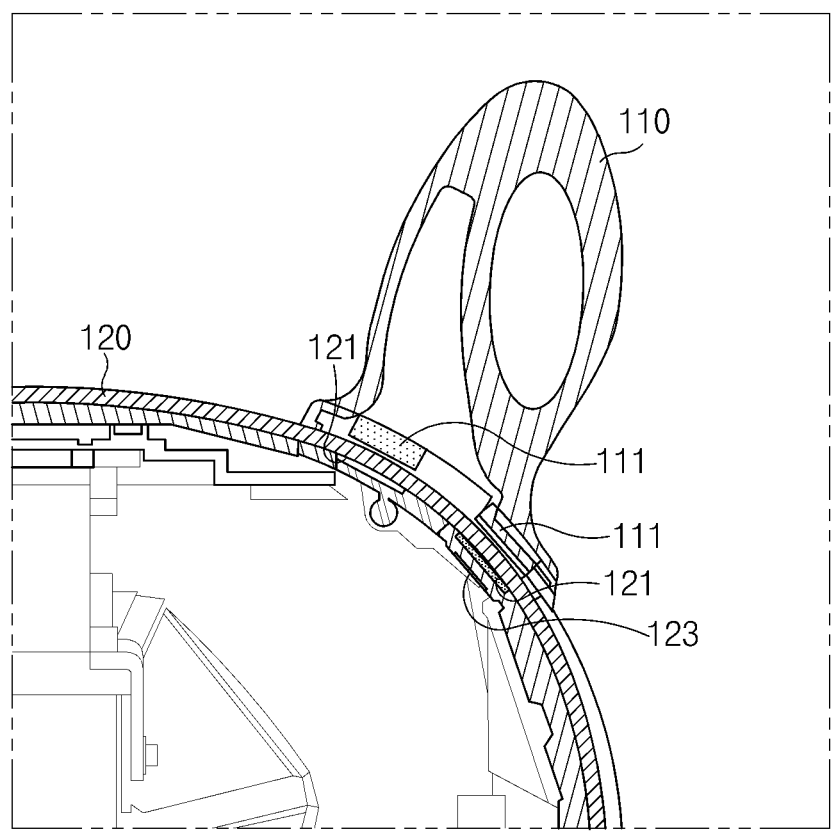
FIG. 2 is a diagram showing one region of an electronic device according to an embodiment.
Figure 3:
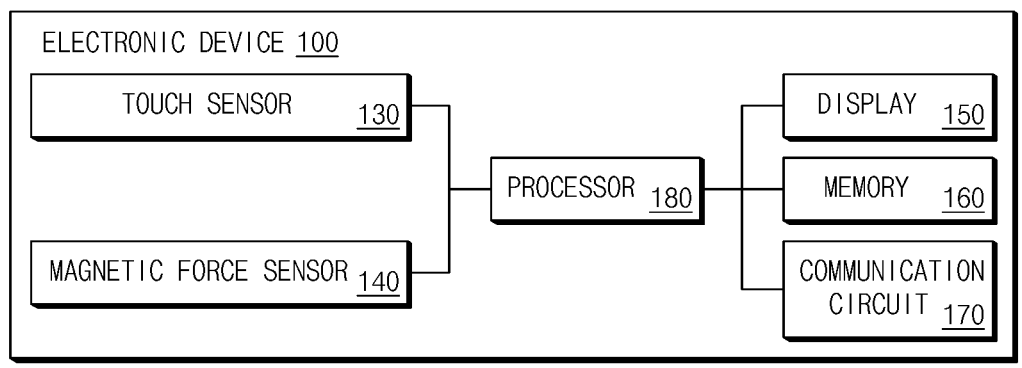
FIG. 3 is a diagram showing a configuration of an electronic device according to an embodiment.

FIG. 2 is a diagram showing one region of an electronic device according to an embodiment, and FIG. 3 is a diagram showing a configuration of an electronic device according to an embodiment.

The electronic device includes a housing 120 with metal plate(s) 121 proximate to an inner wall of the housing 120. The accessory 110 can include magnet (s) 111. A magnetic force between the magnet(s) 111 and the metal plates (2) 121 can attach the accessory 110 to be housing 120 at a region corresponding to the metal plate. The magnetic force detecting sensor 123 measure the intensity and/or polarity of the magnetic field from the magnet(s) 121.

In one embodiment, one region of the electronic device may be understood as a region A shown in FIG. 1, and the region A may represent an embodiment in which an accessory is attached to an interface ¬ defined in a first housing (e.g., 120a in FIG. 1) of an electronic device. However, a following description of the region A may be equally or similarly applied to other regions corresponding to the region A. For example, the following description may be equally or similarly applied to an embodiment in which the accessory is attached to another interface defined in the first housing or an embodiment in which the accessory is attached to another interface defined in a second housing (e.g., 120b in FIG. 1).

Referring to FIG. 2, the accessory 110 may be attached, by magnetic force, or to an interface defined in a housing (e.g., the first housing 120a and/or the second housing 120b in FIG. 1, hereinafter referred to as 120) of an electronic device (100 in FIG. 1). In this regard, at least one metal plate 121 may be disposed in an inner region of the housing 120 corresponding to the interface. In one embodiment, the at least one metal plate 121 may form an attractive force with the at least one magnet 111 included in the accessory 110 to support the attachment of the accessory 110 to the electronic device 100 (or the interface of the housing 120). According to certain embodiments, a quantity or a size of the at least one metal plate 121 may be variously designed based on a mechanical strength of the attachment between the electronic device 100 and the accessory 110.

In certain embodiments, the at least one metal plate 121 may be coupled to an inner wall of the housing 120, or may be disposed adjacent to the inner wall of the housing 120 to facilitate formation of the magnetic force with the at least one magnet 111. Similarly, the at least one magnet 111 inside the accessory 110 may be coupled to or may be disposed adjacent to an inner wall of said one region of the accessory 110 in contact with the housing 120 during the attachment of the accessory 110 in relation to formation of an attractive force with the at least one metal plate 121.

In one embodiment, at least one magnetic force detecting sensor 123 may be disposed below the at least one metal plate 121. For example, the at least one magnetic force detecting sensor 123 may be disposed as one magnetic force detecting sensor 123 or the plurality of magnetic force detecting sensors 123. According to an embodiment, the at least one magnetic force detecting sensor 123 may sense the polarity and the magnetic force strength of the accessory 110 (or the at least one magnet 111 included in the accessory 110) attached to the housing 120.

According to an embodiment, when the at least one magnetic force detecting sensor 123 is composed of one magnetic force detecting sensor 123 and the attached accessory 110 includes one magnet 111, the polarity and the magnetic force strength sensed by said one magnetic force detecting sensor 123 may be different for the sets of accessories 110 based on a polarity, a magnetic force strength, or a placement position of said one magnet 111. According to another embodiment, when the at least one magnetic force detecting sensor 123 is composed of one magnetic force detecting sensor 123 and the attached accessory 110 includes the plurality of magnets 111, the polarity and the magnetic force strength sensed by said one magnetic force detecting sensor 123 may be different for the sets of accessories 110 based on a polarity of the relatively adjacent magnet 111 among the plurality of magnets 111, a magnetic force strength of each of the plurality of magnets 111, or placement positions of the plurality of magnets 111.

According to another embodiment, when the at least one magnetic force detecting sensor 123 is composed of the plurality of magnetic force detecting sensors 123 and the attached accessory 110 includes one magnet 111, the polarity and the magnetic force strength sensed by each of the plurality of magnetic force detecting sensors 123 may be different for the sets of accessories 110 based on the polarity, the magnetic force strength, or the placement position of said one magnet 111. According to another embodiment, when the at least one magnetic force detecting sensor 123 is composed of the plurality of magnetic force detecting sensors 123 and the attached accessory 110 includes the plurality of magnets 111, the polarity and the magnetic force strength sensed by each of the plurality of magnetic force detecting sensors 123 may be different for the sets of accessories 110 based on the polarity of the relatively adjacent magnet 111 among the plurality of magnets 111, the magnetic force strength of each of the plurality of magnets 111, or the placement positions of the plurality of magnets 111.

Referring to FIGS. 2 and 3, the electronic device 100 according to an embodiment may include at least one touch sensor 130, at least one magnetic force detecting sensor 140, the display 150, a memory 160, and a communication circuit 170.

The touch sensor 130 or magnetic force sensor 140 may detected attachment of the accessory 110. The magnetic force sensor 140 can provide measurements of the intensity of the magnetic field and polarity to the processor 180. The processor 180 can determine attributes of the accessory 110 based on the measurements provided by comparing them to data stored in the memory 160. The contents of the memory 160 are described in further detail in Table 1. Based on the attribute, the processor 180 can provide a function or service using the display 150, or communication circuit 170.

In certain embodiments, the electronic device 100 may omit at least one of the above-described components or may additionally include another component. For example, the electronic device 100 may further include at least some of components of an electronic device (1001 in FIG. 10), which will be described later with reference to FIG. 10. According to certain embodiments, the components of the electronic device 100 may be disposed inside a housing (120 in FIG. 1), or at least some of the components of the electronic device 100 may be disposed on the housing 120 and exposed to the outside.

The at least one touch sensor 130 may be disposed inside the housing 120 and sense a touch to an arbitrary object in contact with the housing 120. For example, the at least one touch sensor 130 may sense a touch on the accessory 110 attached to the interface defined in the housing 120. In this regard, the at least one touch sensor 130 may include a plurality of facing electrode plates, and may recognize the attachment of the accessory 110 based on a change in capacitance between the plurality of electrode plates, and sense a touch intensity or the touch area based on the attachment of the accessory 110. An embodiment related to operation of the at least one touch sensor 130 will be described with reference to FIGS. 5 to 8 to be described later.

The at least one magnetic force detecting sensor 123 may be disposed below the at least one metal plate 121 disposed inside the housing 120, and sense the polarity and the magnetic force strength of the accessory 110 attached to the housing 120. According to an embodiment, the at least one magnetic force detecting sensor 123 may transmit the sensed information to a processor 180. In certain embodiments, the magnetic force detecting sensor can include a Hall effect sensor.

The display 150 may output various contents corresponding to video information. For example, the display 150 may output the user interface of the scenario or the theme corresponding to the attribute of the accessory 110 attached to the electronic device 100 under control of the processor 180. As another example, the display 150 may output the persona (e.g., the animal image or the animal video) corresponding to the attribute of the accessory 110 attached to the electronic device 100 under the control of the processor 180. In certain embodiments, the display 150 may include a touch screen display including a touch panel (or a touch sensor).

The memory 160 may store at least one signal or data related to operation of the electronic device 100, or may store at least one command related to functional operations of the components of the electronic device 100. For example, the memory 160 may display video information of a plurality of user interfaces or video information of a plurality of personae to be output through the display 150 based on the attribute of the accessory 110 attached to the electronic device 100. Alternatively, the memory 160 may store a table referenced for determining the attribute of the accessory 110 attached to the electronic device 100.

TABLE 1

| First interface | Second interface | Attribute information |
|---|---|---|
| N pole Gauss 3500 | N pole Gauss 3500 | Dinosaur |
| N pole Gauss 2000 | N pole Gauss 2000 | Rabbit |
| S pole Gauss 2500 | S pole Gauss 2500 | Bear |
| S pole Gauss 3000 | S pole Gauss 3000 | Giraffe |
| . . . | . . . | . . . |

Table 1 above may represent an example of the table stored in the memory 160. Referring to Table 1, the table may include the polarity and the magnetic force strength that may be sensed when the accessories 110 of the set of the same attribute are respectively attached to the plurality of interfaces defined in the housing 120 of the electronic device 100, and attribute information corresponding to the polarity and the magnetic force strength. For example, the table may include the polarities, the magnetic force strengths, and the attribute information in a distinguished manner for the sets of accessories 110, each of which includes the plurality of accessories 110 attachable to the electronic device 100.

Table 1 can be stored in the memory 160 during manufacture. Additionally, additional entries can be stored to the memory 160 as updates and the like using from a server. In certain embodiments, the user may also add entries.

According to the table presented in Table 1 above, when N pole and magnetic force strength Gauss 3500 are sensed for a first accessory attached to a first interface, and the N pole and the magnetic force strength Gauss 3500 are sensed for a second accessory attached to a second interface, the first accessory and the second accessory may be determined as the set of accessories 110 having the same attribute. In this case, a dinosaur corresponding to the N pole and the magnetic force strength Gauss 3500 sensed as an attribute (e.g., the type, the model, the version, the design, the symbol, and/or the identification information of the accessory 110) of the corresponding set of accessories 110 may be determined.

The table presented in Table 1 is in accordance with one embodiment, and the disclosure is not limited thereto. The table stored in the memory 150 may be generated in consideration of at least one element related to the determination of the attribute of the accessory 110. For example, the table may be generated in consideration of a quantity of the at least one magnetic force detecting sensor 123 disposed inside the housing 120 to include information (e.g., the polarity, the magnetic force strength, and the attribute) of the accessory 110 that may be sensed or determined based on each quantity.

The communication circuit 170 may support communication between the electronic device 100 and at least one external device. For example, the communication circuit 170 may establish wired communication or wireless communication based on a prescribed protocol with the at least one external device, and perform transmission and reception of data or signals through the wired communication or the wireless communication.

The processor 180 may be implemented as at least one of a central processing unit, an application processor, and a communication processor to control the components of the electronic device 100 described above. For example, the processor 180 may be electrically or operatively connected to the components of the electronic device 100 to transmit at least one command related to a functional operation to the components or perform various operations or data processing.

In one embodiment, the processor 180 may receive sensing information of the polarity and the magnetic force strength for each of the plurality of accessories 110 attached to the electronic device 100 from the at least one magnetic force detecting sensor 123, and determine whether the plurality of accessories 110 correspond to the set of accessories 110 having the same attribute based on the sensing information. For example, the processor 180 may determine that the first accessory and the second accessory correspond to the set of accessories 110 of the same attribute when information (e.g., a polarity and a magnetic force strength) of the first accessory provided from the at least one magnetic force detecting sensor 123 corresponding to the first interface defined in the housing 120 (or disposed below the first interface) and information of the second accessory provided from the at least one magnetic force detecting sensor 123 corresponding to the second interface are the same.

In one embodiment, when it is determined that the first accessory and the second accessory correspond to the set of accessories 110 of the same attribute, the processor 180 may identify attribute information corresponding to the information (e.g., the polarity and the magnetic force strength) of the first accessory and the second accessory with reference to a table built in the memory 160. The processor 180 may determine the identified attribute information as an attribute of the first accessory and the second accessory, and may provide a function or a service corresponding to the determined attribute of the first accessory and the second accessory. For example, the processor 180 may control the display 150 to output a user interface or a persona corresponding to the determined attribute of the first accessory and the second accessory. As another example, the processor 180 may control the at least one speaker (not shown) to output a sound corresponding to the attribute of the first accessory and the second accessory.

In certain embodiments, the processor 180 may compile statistics of the attributes of the accessory 110 determined during a specified period, and collect a content related to an attribute of the accessory 110 determined a relatively large number of times. In this regard, the processor 180 may output a pop-up message inquiring about the collection of the content through the display 150, and determine the collection of the content based on a response input (e.g., a touch input or a voice input) of the user. When receiving a response input permitting the collection of the content from the user, the processor 180 may download a content from a specified external server (e.g., a content providing server) through the communication circuit 170 and store the content in the memory 160. In certain embodiments, the content stored in the memory 160 may be later used as at least a portion of a user interface or a persona that is output based on the determination of the attribute of the accessory 110.

In certain embodiments, the electronic device 100 may further include at least one microphone (e.g., 20 in FIG. 5) to receive voice data based on an utterance input (e.g., the voice input) of the user, analyze the voice data, and perform a corresponding function operation or a response utterance. In this regard, the processor 180 may include an automatic speech recognition (ASR) module and a natural language understanding (NLU) module for analyzing the voice data. The ASR module may recognize the received voice data and convert the voice data into text data. For example, the ASR module may convert the voice data into the text data using an acoustic model including at least one information related to the utterance or a language model including at least one unit phoneme information and information on combinations of the unit phonemes. The NLU module may receive the text data from the ASR module, and may derive an intention of the utterance input of the user based on the text data. For example, the NLU module may divide the text data into grammatical units (e.g., words, phrases, or morphemes) and analyze grammatical elements or linguistic characteristics of each unit to determine meaning of the text data, thereby deriving the intention of the utterance input of the user. The processor 180 may control other components of the electronic device 100 to perform the function operation or the response utterance corresponding to the derived intention of the utterance input of the user.

Figure 4:
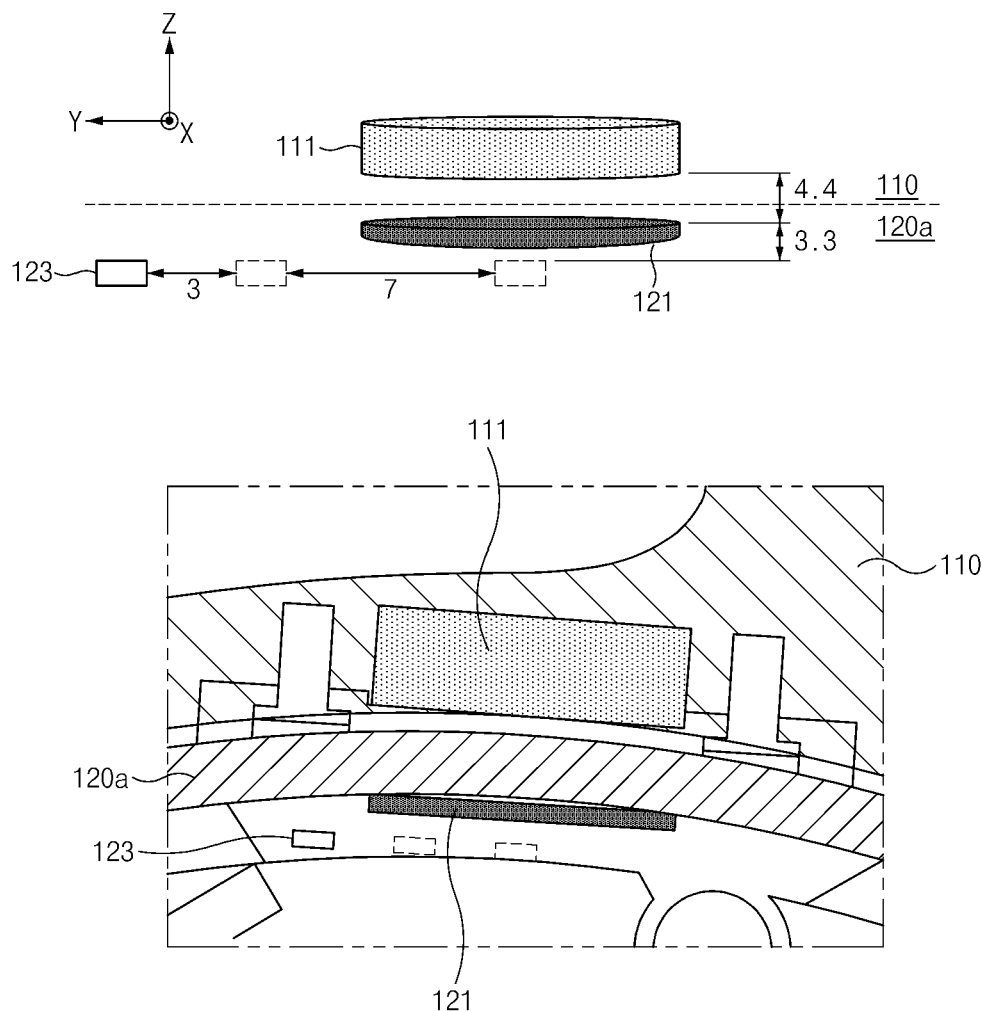
FIG. 4 is a diagram showing an arrangement form between electronic device components according to an embodiment.

FIG. 4 is a diagram showing an arrangement form between electronic device components according to an embodiment.

Referring to FIG. 4, components that support attachment of an accessory (110 in FIG. 1 or FIG. 2) to an electronic device (100 in FIG. 1 or FIG. 3) and the attribute determination of the attached accessory 110 may be disposed to be spaced apart from each other by a specified spacing distance. For example, the at least one magnet 111 disposed inside the accessory 110 and the at least one metal plate 121 disposed inside the housing 120a (e.g., the first housing 120a in FIG. 1) may be respectively disposed inside the accessory 110 and inside the housing 120a to form a Z-axis spacing up to about 4.4 mm when the accessory 110 is attached.

According to an embodiment, in the case of the at least one magnetic force detecting sensor 123 disposed below the at least one metal plate 121 and inside the housing 120a, the at least one magnetic force detecting sensor 123 may be disposed to form a Z-axis spacing up to about 3.3 mm with the at least one metal plate 121. In addition, the at least one magnetic force detecting sensor 123 may be disposed in a region below the at least one metal plate 121 to form a Y-axis spacing up to about 10 mm with respect to a central axis of the at least one magnet 111 or the at least one metal plate 121. For example, the at least one magnetic force detecting sensor 123 may be disposed in at least one of a region corresponding to the central axis of the at least one magnet 111 or the at least one metal plate 121, a region about 7 mm apart from the central axis in a direction of a Y-axis, and a region about 10 mm apart from the central axis.

Figure 5:
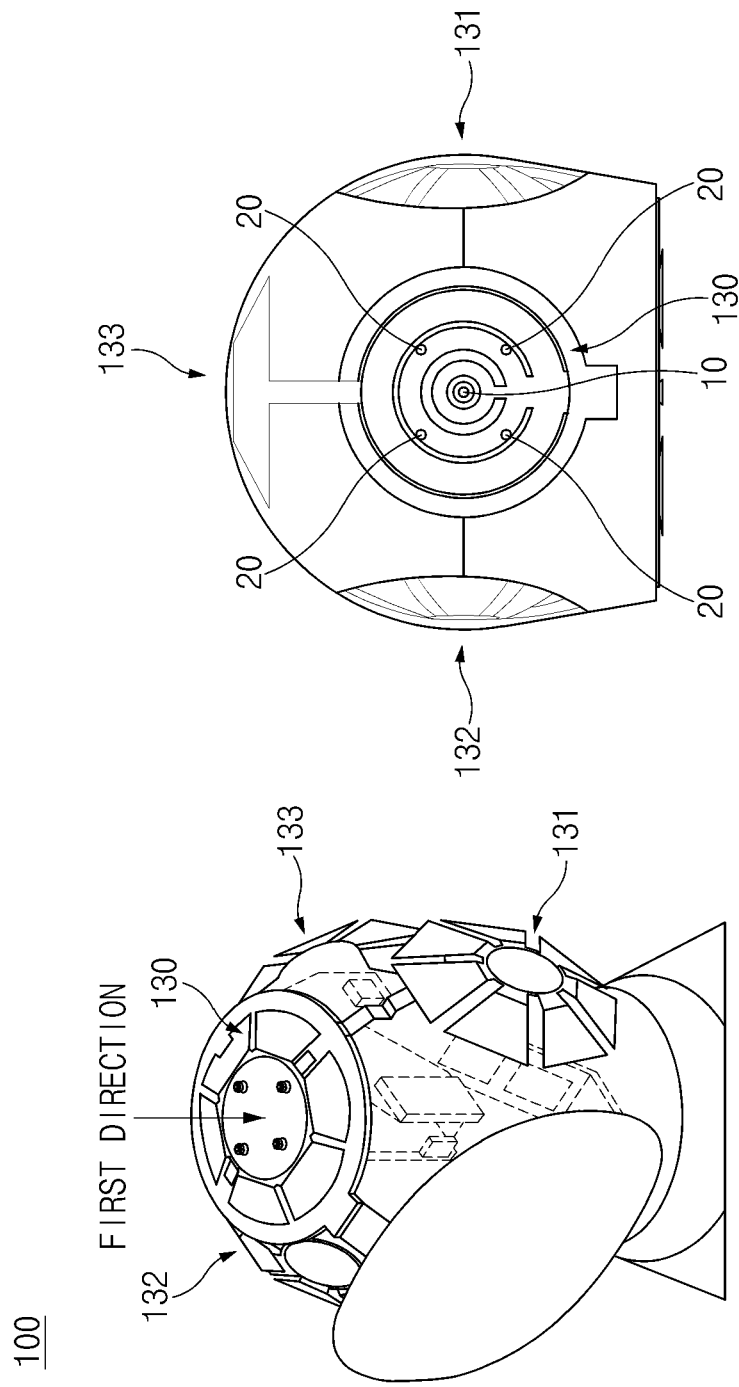
FIG. 5 is a diagram showing a shape in a first direction of an electronic device according to another embodiment.
Figure 6:
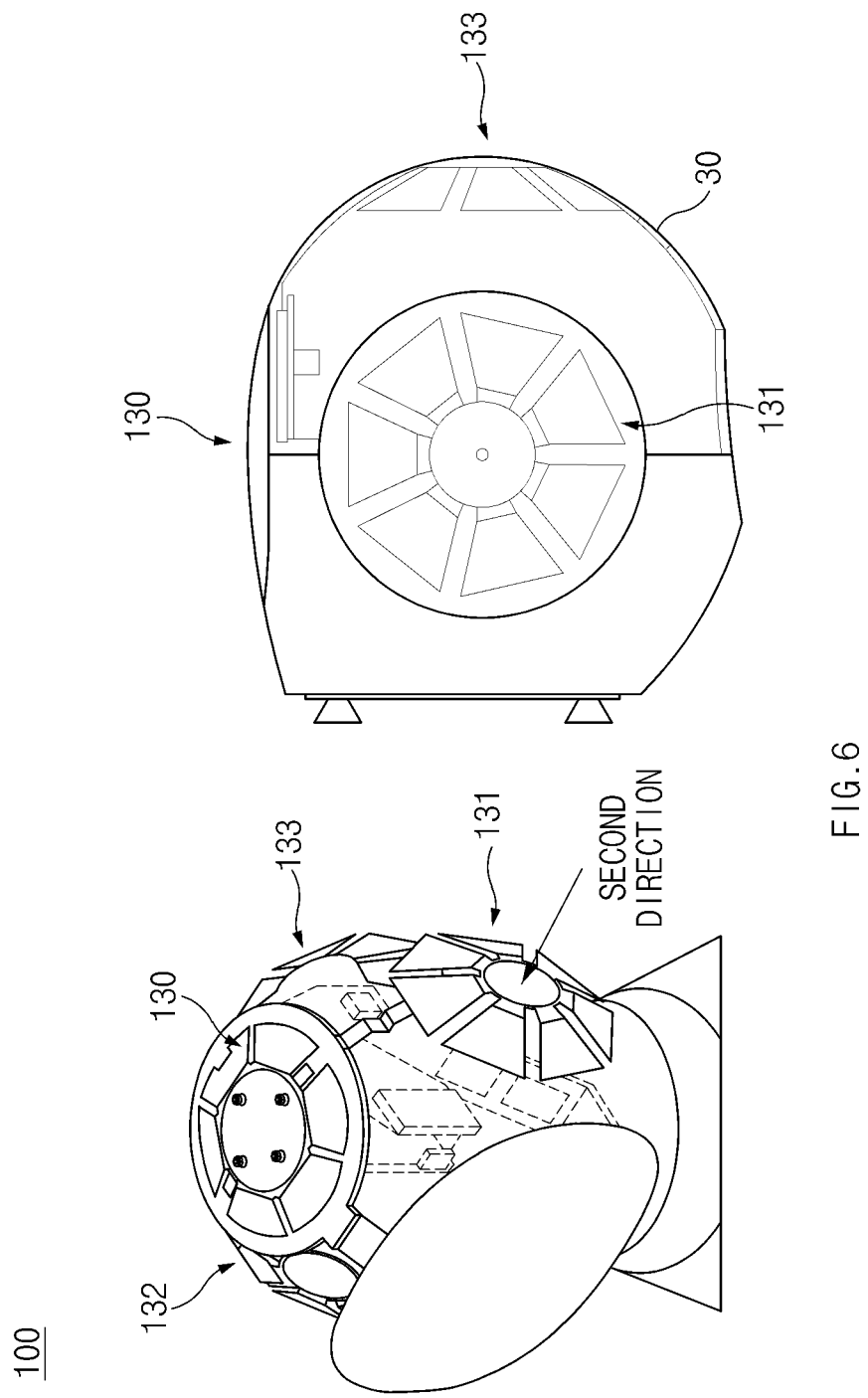
FIG. 6 is a diagram showing a shape in a second direction of an electronic device according to another embodiment.
Figure 7:
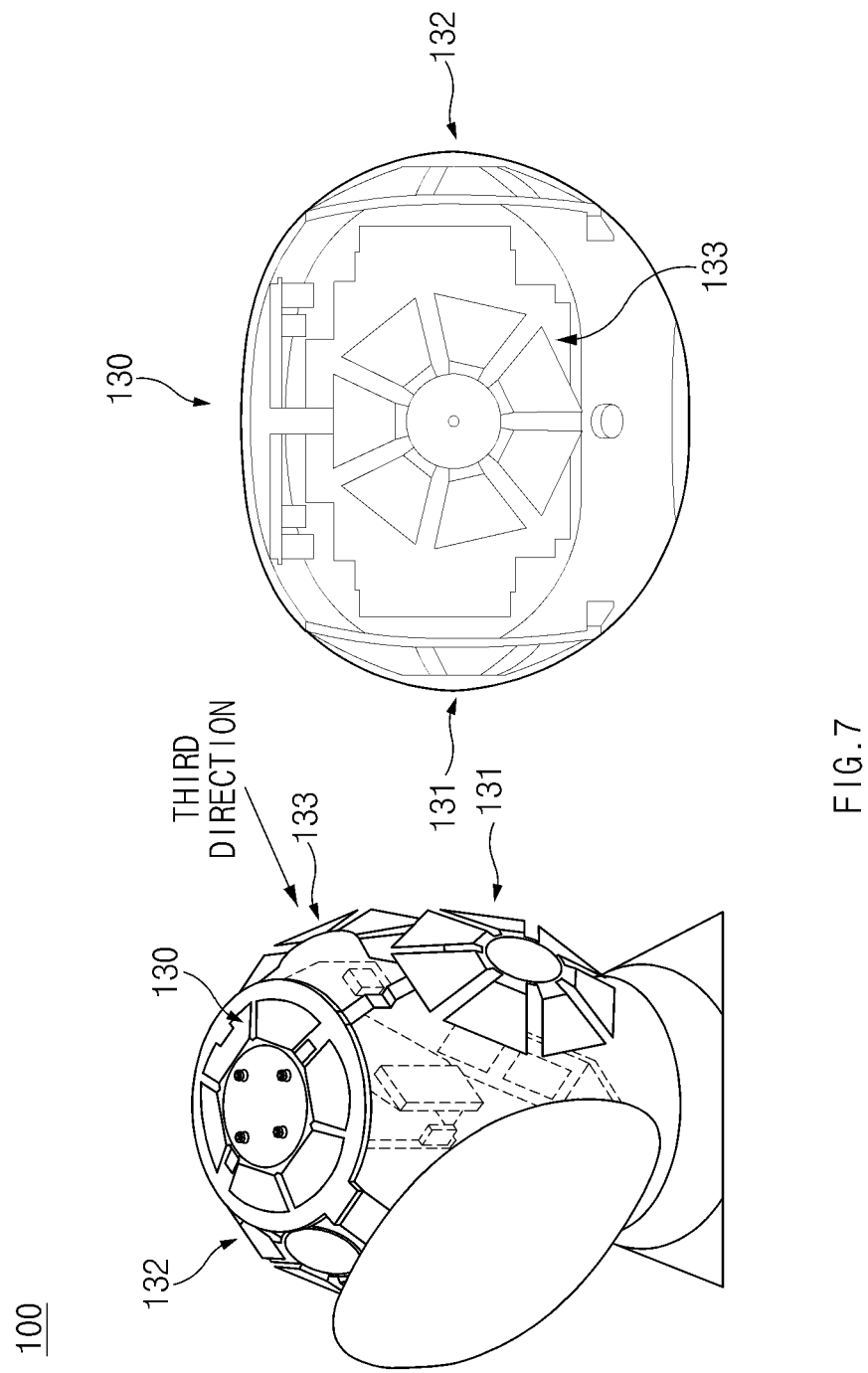
FIG. 7 is a diagram showing a shape in a third direction of an electronic device according to another embodiment.

FIG. 5 is a diagram showing a shape in a first direction of an electronic device according to another embodiment, FIG. 6 is a diagram showing a shape in a second direction of an electronic device according to another embodiment, and FIG. 7 is a diagram showing a shape in a third direction of an electronic device according to another embodiment.

FIGS. 5, 6, and 7 may relate to an embodiment in which at least one touch sensor is disposed inside a first housing (e.g., 120a in FIG. 1) of an electronic device, and may show a shape of the electronic device from which the first housing is removed for convenience of understanding. In certain embodiments, the at least one touch sensor may be further disposed inside a second housing (e.g., 120b in FIG. 1) of the electronic device in addition to the inside of the first housing. In this regard, a following description of the at least one touch sensor disposed inside the first housing may equally or similarly apply to the at least one touch sensor that may be further disposed inside the second housing.

Referring to FIGS. 5, 6, and 7, inside a housing (e.g., the first housing 120a and/or the second housing 120b in FIG. 1, hereinafter referred to as 120) of the electronic device 100, at least one touch sensor for recognizing an accessory (110 in FIG. 1 or FIG. 2) attached to an interface of the housing 120 may be disposed. In one embodiment, the at least one touch sensor may be disposed to substantially cover most of the housing 120. In this regard, the at least one touch sensor may be composed of a plurality of touch sensors. For example, the at least one touch sensor may be composed of a plurality of touch sensors including a first touch sensor 130, a second touch sensor 131, a third touch sensor 132, and a fourth touch sensor 133. In certain embodiments, the plurality of touch sensors 130, 131, 132, and 133 may be formed to have the same or similar size (or an area) in a range of not overlapping each other.

In one embodiment, the plurality of touch sensors 130, 131, 132, and 133 may be disposed in different regions within the housing 120 and be directed in different directions, respectively. For example, the first touch sensor 130 may be disposed in a first region (e.g., an inner region of the housing 120 corresponding to a top portion of the housing 120) corresponding to a first direction and may be directed in an upward direction of the housing 120. Each of the second touch sensor 131 and the third touch sensor 132 may be disposed in each of a plurality of second regions (e.g., inner regions of the housing 120 respectively corresponding to lateral portions of the housing 120) corresponding to a second direction, and may be directed in a lateral direction of the housing 120. The fourth touch sensor 133 may be disposed in a third region (e.g., an inner region of the housing 120 corresponding to a rear portion of the housing 120) corresponding to a third direction, and may be directed in a rearward direction of the housing 120. According to certain embodiments, at least one first microphone 10 related to operation of a call function of the electronic device 100 and at least one second microphone 20 related to reception of the utterance input of the user may be disposed in a region (e.g., a region not corresponding to a sensing region) of the first touch sensor 130. According to certain embodiments, a hardware button 30 capable of controlling ON and OFF of the electronic device 100 may be disposed in a region adjacent to the fourth touch sensor 133.

In one embodiment, when the plurality of touch sensors 130, 131, 132, and 133 are shielded by the housing 120, at least some of the plurality of touch sensors 130, 131, 132, and 133 may at least partially overlap with a region 40 in which the interface defined in the housing 120 is located. The region 40 in which the interface is located is in accordance with an example, and may be changed based on a location at which the interface is defined in the housing 120.

In one embodiment, in the region 40 in which the interface is located, at least one metal plate (121 in FIG. 2 or FIG. 4) for forming an attractive force with at least one magnet (111 in FIG. 2 or FIG. 4) inside the accessory 110 attached to the interface and may be disposed. For example, the at least one metal plate 121 may be disposed in a region where overlapping with the plurality of touch sensors 130, 131, 132, and 133 is avoided within the region 40 in which the interface is located.

In one embodiment, each of the plurality of accessories 110 attachable to the housing 120 may further include the dielectric therein. For example, the dielectric may be disposed to be coupled to or adjacent to the inner wall of one region of the accessory 110 in contact with the housing 120 when the accessory 110 is attached. According to an embodiment, at least one of the dielectric permittivity and the size (or the area) of the dielectric may be different for the sets of accessories 110. In other words, dielectrics respectively included the accessories 110 of the set having the same attribute may have the same dielectric permittivity and size, but may have at least one of the dielectric permittivity and the size different from that of a dielectric included in another accessory 110 (or another set of accessories 110) different from the set of accessories 110.

In one embodiment, one or more of the plurality of touch sensors 130, 131, 132, and 133 overlapping the plurality of accessories 110 attached to the interfaces of the housing 120, respectively, may sense touch areas based on dielectric areas and touch sensitivities based on dielectric permittivities of the respective attached plurality of accessories 110. The one or more touch sensors may transmit sensed information to a processor (180 in FIG. 3).

In one embodiment, the processor 180 may receive sensing information of the plurality of accessories 110 from the one or more touch sensors overlapping the plurality of accessories 110 attached to the housing 120, respectively, and determine whether the attached plurality of accessories 110 correspond to the set of accessories 110 having the same attribute based on the sensing information. For example, the processor 180 may determine that the first accessory and the second accessory correspond to the set of accessories 110 of the same attribute when information (e.g., a touch area and a touch sensitivity) of the first accessory provided from a touch sensor overlapping the attached first accessory and information of the second accessory provided from a touch sensor overlapping the attached second accessory are the same.

In one embodiment, when it is determined that the first accessory and the second accessory correspond to the set of accessories 110 of the same attribute, the processor 180 may identify attribute information corresponding to the information (e.g., the touch area and the touch sensitivity) of the first accessory and the second accessory with reference to a table built in a memory (160 in FIG. 3).

In one embodiment, the processor 180 may determine the identified attribute information as the attribute of the first accessory and the second accessory, and may provide the function or the service corresponding to the determined attribute of the first accessory and the second accessory. For example, the processor 180 may control the display 150 to output the user interface or the persona corresponding to the determined attribute of the first accessory and the second accessory. As another example, the processor 180 may control the at least one speaker (not shown) to output the sound corresponding to the attribute of the first accessory and the second accessory.

TABLE 2

| First interface | Second interface | Attribute information |
|---|---|---|
| Area A sensitivity 31000 or higher | Area A sensitivity 31000 or higher | Alligator |
| Area B sensitivity 28000~31000 | Area B sensitivity 28000~31000 | Tiger |
| Area C sensitivity 20000~28000 | Area C sensitivity 20000~28000 | Lion |
| . . . | . . . | . . . |

Table 2 may represent an example of the table stored in the memory 160. Referring to Table 2, the table may include the touch area and the touch intensity that may be sensed when the accessories 110 of the set of the same attribute are respectively attached to the plurality of interfaces defined in the housing 120 of the electronic device 100, and attribute information corresponding to the touch area and the touch intensity. For example, the table may include the touch areas, the touch intensities, and the attribute information in a distinguished manner for the sets of accessories 110, each of which includes the plurality of accessories 110 attachable to the electronic device 100.

According to the table presented in Table 2 above, when touch area A and touch sensitivity 31000 or higher are sensed for the first accessory attached to the first interface, and the touch area A and the touch sensitivity 31000 or higher are sensed for the second accessory attached to the second interface, the first accessory and the second accessory may be determined as the set of accessories 110 having the same attribute. In this case, an alligator corresponding to the touch area A and the touch sensitivity 31000 or higher sensed as the attribute (e.g., the type, the model, the version, the design, the symbol, and/or the identification information of the accessory 110) of the corresponding set of accessories 110 may be determined.

Figure 8:
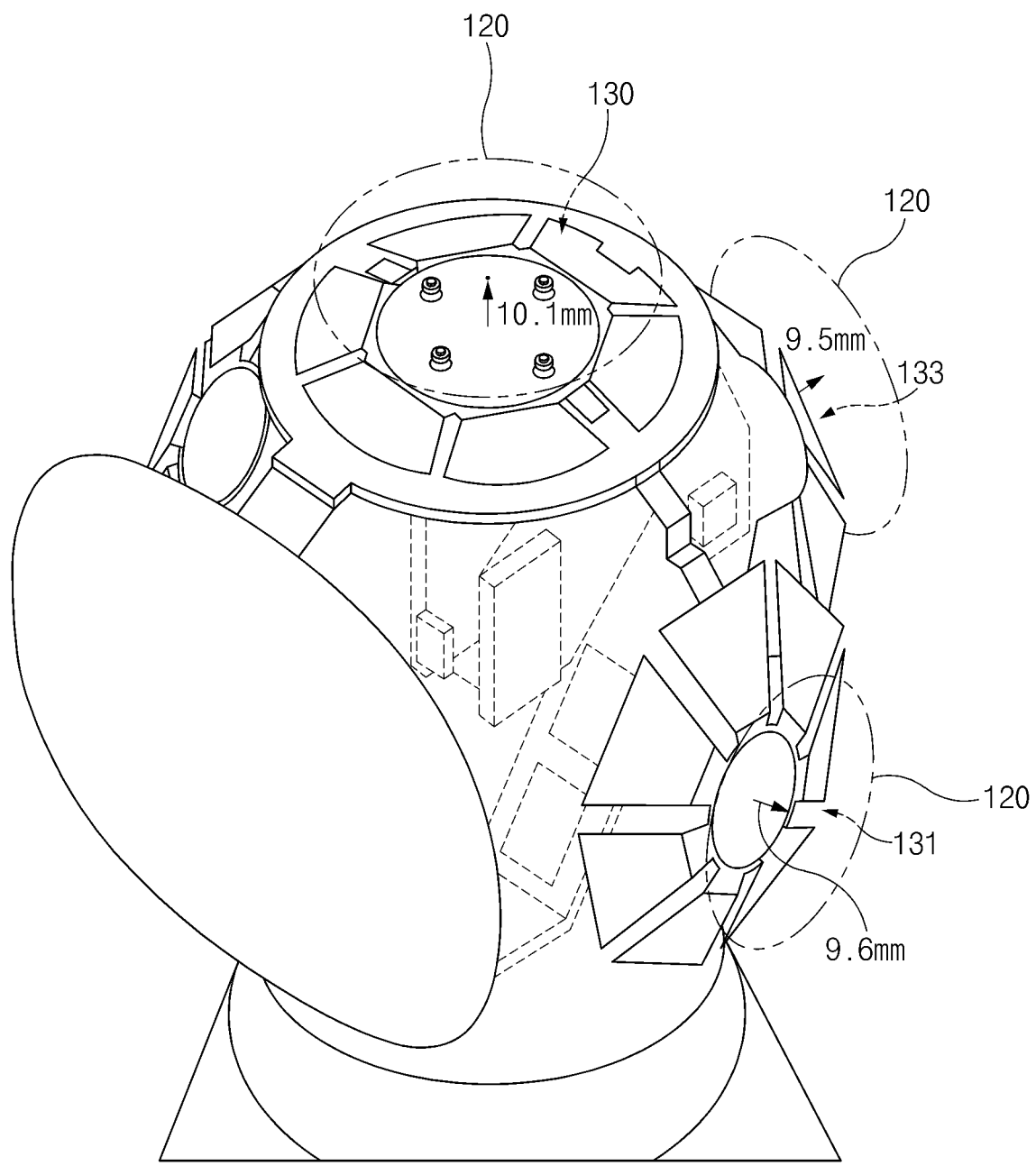
FIG. 8 is a diagram showing an arrangement form between electronic device components according to another embodiment.

FIG. 8 is a diagram showing an arrangement form between electronic device components according to another embodiment.

Referring to FIG. 8, the plurality of touch sensors 130, 131, 132, and 133 that support determination of an attribute of an accessory (110 in FIG. 1 or 2) attached to an electronic device (100 in FIG. 1, 3, 5, 6, or, 7) may be disposed inside the housing 120a while forming a specified spacing distance from the housing 120a (e.g., the first housing 120a in FIG. 1). For example, the first touch sensor 130 directed in the upward direction of the housing 120a may be disposed to form a gap up to about 10.1 mm from the housing 120a. Each of the second touch sensor 131 and the third touch sensor 132 directed in the lateral direction of the housing 120a may be disposed to form a gap up to about within 9.6 mm from the housing 120a. The fourth touch sensor 133 directed in the rearward direction of the housing 120a may be disposed to form a gap up to about 9.5 mm from the housing 120a.

Figure 9:
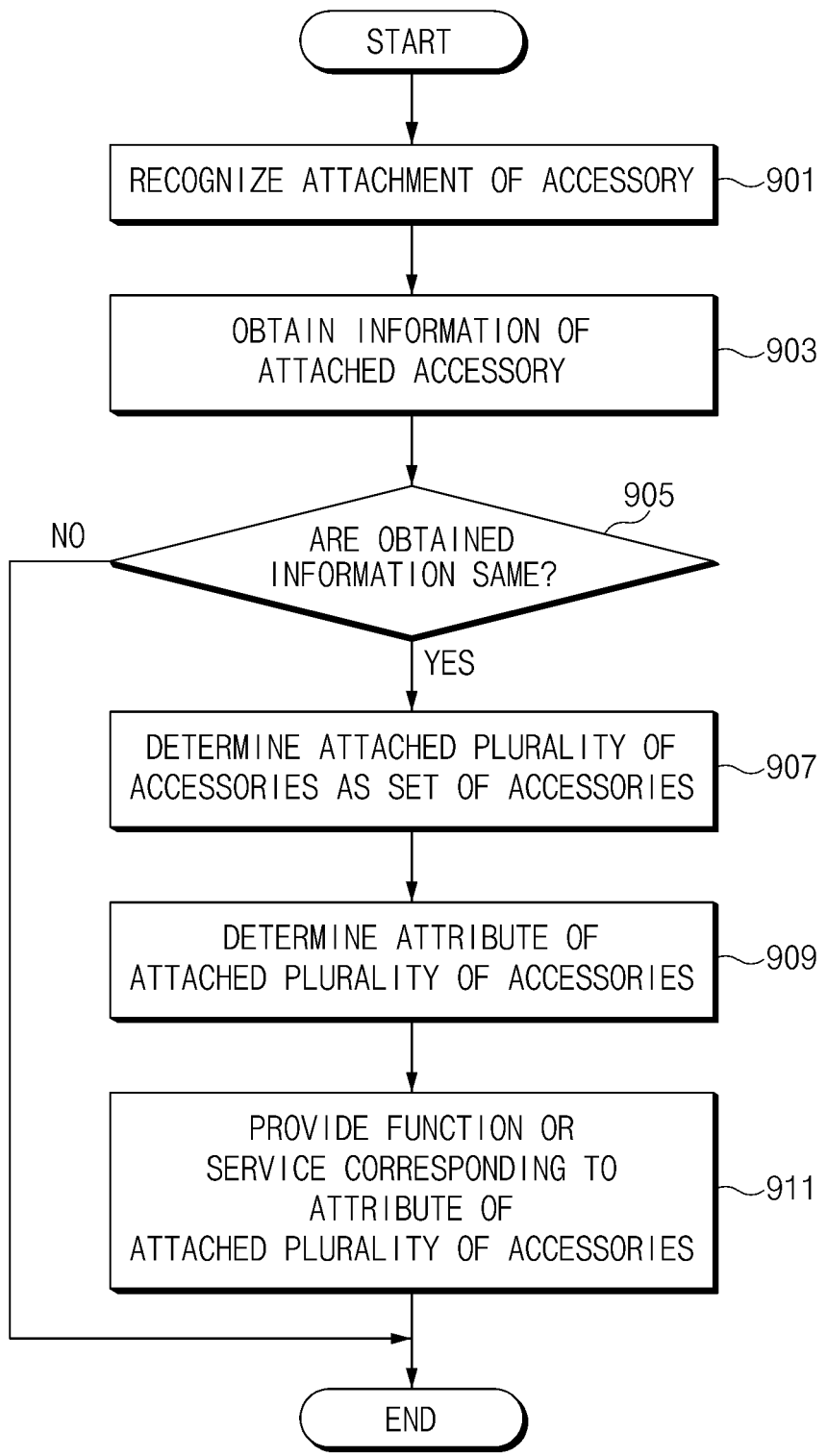
FIG. 9 is a diagram showing a method for recognizing an accessory of an electronic device according to an embodiment.

FIG. 9 is a diagram showing a method for recognizing an accessory of an electronic device according to an embodiment.

In relation to operation of an electronic device to be described below, at least one information that may be referred to in determining an attribute of an accessory attached to the electronic device may be stored in advance in a memory included in the electronic device. The at least one information may, for example, include a polarity and a magnetic force strength that may be sensed when a set of accessories of the same attribute is attached, and accessory attribute information corresponding to the polarity and the magnetic force strength. Alternatively, the at least one information may, for example, include a touch area and a touch intensity that may be sensed when the set of accessories of the same attribute is attached, and accessory attribute information corresponding to the touch area and the touch intensity. In certain embodiments, the at least one information may be stored in a form of tables distinguished for sets of accessories. An operation of the electronic device to be described below may be at least partially the same as or similar to that described above with reference to FIGS. 1 to 8, and duplicated description may be omitted.

Referring to FIG. 9, in operation 901, a processor (180 in FIG. 3) of an electronic device (100 in FIG. 1, 3, 5, 6, or 7) may recognize attachment of an accessory (110 in FIG. 1 or FIG. 2) to an interface defined in a housing (120a and/or 120b in FIG. 1, hereinafter, referred to as 120) of the electronic device 100. For example, when at least one magnetic force detecting sensor (123 in FIG. 2 or FIG. 3) disposed inside the housing 120 senses specified information (e.g., the polarity and the magnetic force strength), the processor 180 may recognize that the accessory 110 is attached to the electronic device 100. As another example, when at least one touch sensor (130, 131, 132, and/or 133 in FIG. 5, 6, or 7) disposed inside the housing 120 senses specified information (e.g., the touch area and the touch intensity), the processor 180 may recognize that the accessory 110 is attached to the electronic device 100.

In operation 903, the processor 180 may obtain information sensed for the accessory 110 attached to the electronic device 100. For example, the processor 180 may obtain polarity information and magnetic force strength information of each of the plurality of accessories 110 attached to the plurality of interfaces defined in the housing 120 from the at least one magnetic force detecting sensor 123. As another example, the processor 180 may obtain touch area information and touch intensity information of each of the plurality of accessories 110 attached to the plurality of interfaces defined in the housing 120 from the at least one touch sensor 130, 131, 132, and/or 133.

In operation 905, the processor 180 may determine whether the attached plurality of accessories 110 are the set of accessories 110 having the same attribute based on the obtained information. In this regard, the plurality of accessories 110 corresponding to the set of accessories 110 having the same attribute may have the same quantity, placement position, polarity, and magnetic force strength of at least one magnet (111 in FIG. 2 or FIG. 4) therein. Alternatively, the plurality of accessories 110 corresponding to the set of accessories 110 having the same attribute may have the same dielectric permittivity and size of dielectrics (not shown) respectively included therein.

In operation 907, when the polarity information and the magnetic force strength information of the attached plurality of accessories 110 are the same, the processor 180 may determine the attached plurality of accessories 110 as the set of accessories 110 having the same attribute. Alternatively, when the touch area information and the touch intensity information of the attached plurality of accessories 110 are the same, the processor 180 may determine the attached plurality of accessories 110 as the set of accessories 110 having the same attribute.

In operation 909, the processor 180 may determine the attribute of the attached plurality of accessories 110 determined as the set of accessories 110 having the same attribute. For example, referring to the at least one information stored in advance in the memory (160 in FIG. 3), the processor 180 may identify the attribute information of the accessory 110 corresponding to the polarity information and the magnetic force strength information of the attached plurality of accessories 110. As another example, referring to the at least one information stored in advance in the memory 160, the processor 180 may identify the attribute information of the accessory 110 corresponding to the touch area information and the touch intensity information of the attached plurality of accessories 110. The processor 180 may determine the identified attribute information of the accessory 110 as the attribute of the attached plurality of accessories 110.

In operation 911, the processor 180 may provide the function or the service corresponding to the attribute of the attached plurality of accessories 110. For example, the processor 180 may control a display (150 in FIG. 3) to output the user interface including the scenario or the theme corresponding to the attribute of the attached plurality of accessories 110. As another example, the processor 180 may control the display 150 to output the persona (e.g., the animal image or the animal video) corresponding to the attribute of the attached plurality of accessories 110. As another example, the processor 180 may control the at least one speaker (not shown) to output the sound (e.g., the animal sound) corresponding to the attribute of the attached plurality of accessories 110.

An electronic device according to certain embodiments described above may include a housing, at least one metal plate disposed inside the housing, at least one magnetic force detecting sensor disposed below the at least one metal plate, a memory, and a processor operatively connected to the at least one magnetic force detecting sensor and the memory.

According to certain embodiments, the processor may recognize the attachment of the at least one accessory to the specified region of the housing based on an intensity of a magnetic force and a polarity sensed by the at least one magnetic force detecting sensor, the at least one accessory including at least one magnet inside the at least one accessory, and determine an attribute of the attached at least one accessory corresponding to the sensed intensity of the magnetic force and polarity using information stored in the memory.

According to certain embodiments, the specified region of the housing may include at least one of a groove, and a line.

According to certain embodiments, the housing and the at least one accessory comprises a silicone material.

According to certain embodiments, the at least one metal plate is coupled to or adjacent to an inner wall of the housing.

According to certain embodiments, wherein the at least one magnet is coupled to or adjacent to an inner wall of one region of the at least one accessory in contact with the specified region of the housing.

According to various embodiments, the at least one accessory may include a plurality of accessories.

According to certain embodiments, the plurality of accessories may include at least one set of accessories having the same quantity, placement position, polarity, and magnetic force strength of the at least one magnet.

According to certain embodiments, the specified region of the housing may include a plurality of regions.

According to certain embodiments, the at least one information stored in the memory may include polarity information magnetic force strength information, and attribute information of each of the plurality of accessories.

According to certain embodiments, the processor may receive the polarity information and the magnetic force strength information of each of the plurality of accessories from the at least one magnetic force detecting sensor, and determine the plurality of accessories as a set of accessories when the polarity information and the magnetic force strength information of the plurality of accessories are substantially the same.

According to certain embodiments, the processor may identify accessory attribute information of the plurality of accessories determined based on the polarity information and the magnetic force strength information received from the sensor and the polarity information, magnetic force information, and attribute information stored in the memory, and provide a function or a service corresponding to the identified accessory attribute information.

According to certain embodiments, the electronic device may further include a display.

According to certain embodiments, the provision of the function or service comprises output a user interface corresponding to the identified accessory attribute information or output a persona corresponding to the identified accessory attribute information using the display.

According to certain embodiments, the electronic device may further include at least one speaker.

According to certain embodiments, the provision of the function or service comprises output a sound corresponding to the identified accessory attribute information using the at least one speaker.

According to certain embodiments, the electronic device may further include a communication circuit.

According to certain embodiments, the provision of the function or the service comprises compile statistics of the identified accessory attribute information during a specified period, and download a content from a specified external server using the communication circuit related to accessory attribute information identified in excess of a predetermined number of times.

An electronic device according to certain embodiments described above may include a housing, at least one touch sensor disposed inside the housing, a memory, and a processor operatively connected to the at least one touch sensor and the memory.

According to certain embodiments, the processor may recognize the attachment of at least one accessory to the specified region of the housing based on a touch area and a touch intensity sensed by the at least one touch sensor, wherein the at least one accessory comprises a dielectric disposed inside the at least one accessory, and determine an attribute of the attached at least one accessory corresponding to the sensed touch area and touch intensity using at least information stored in the memory.

According to certain embodiments, the at least one accessory may include a plurality of accessories, and the plurality of accessories may include at least one set of accessories having the same dielectric permittivity and size.

According to certain embodiments, the specified region of the housing may include a plurality of regions.

According to certain embodiments, the at least one information stored in the memory may include touch area information and touch intensity information of each of the plurality of accessories capable of being sensed by the at least one touch sensor when the plurality of accessories composed of a set of accessories are respectively attached to the plurality of regions, and accessory attribute information corresponding to the touch area information and the touch intensity information.

According to certain embodiments, the processor may receive the touch area information and the touch intensity information of each of the plurality of accessories respectively attached to the plurality of regions from the at least one touch sensor, and determine the plurality of accessories as a set of accessories when the touch area information and the touch intensity information of the plurality of accessories are the same.

According to certain embodiments, the processor may identify accessory attribute information corresponding to touch area information and touch intensity information of the plurality of accessories determined as the set of accessories using the at least one information stored in the memory, and provide a function or a service corresponding to the identified accessory attribute information.

According to certain embodiments, the electronic device may further include a display and at least one speaker.

According to certain embodiments, the processor may output a user interface of a scenario or a theme corresponding to the identified accessory attribute information or output a persona corresponding to the identified accessory attribute information as at least a portion of the provision of the function or the service using the display, or output a sound corresponding to the identified accessory attribute information using the at least one speaker.

According to certain embodiments, the at least one touch sensor may be disposed to overlap at least partially with the specified region of the housing.

According to certain embodiments, the at least one touch sensor may include a plurality of touch sensors.

According to certain embodiments, the plurality of touch sensors may include a first touch sensor for sensing attachment of the at least one accessory to a top portion of the housing, at least one second touch sensor for sensing attachment of the at least one accessory to a lateral portion of the housing, and a third touch sensor for sensing attachment of the at least one accessory to a rear portion of the housing.

Figure 10:
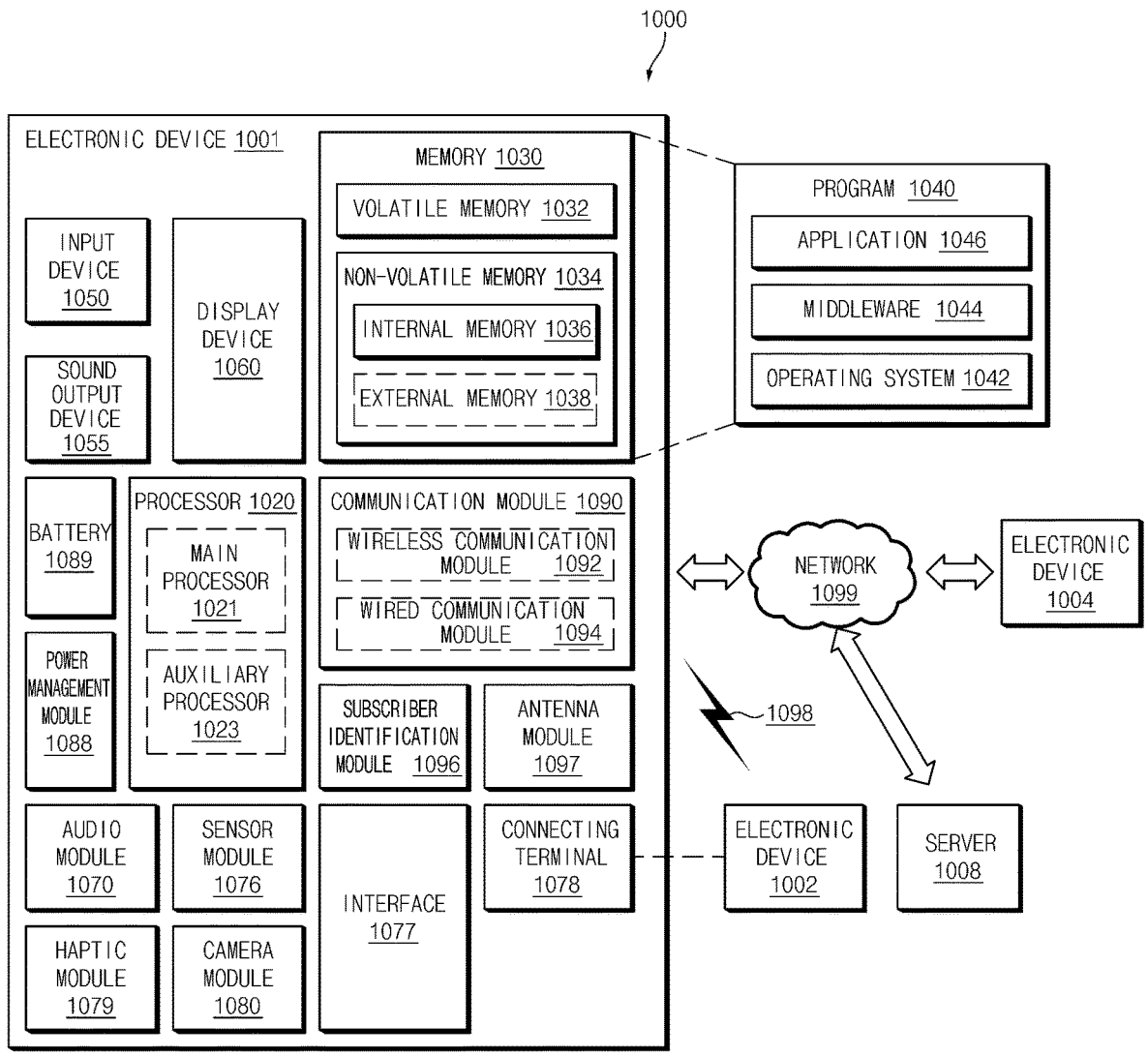
FIG. 10 is a diagram showing an electronic device in a network environment according to an embodiment.

FIG. 10 is a block diagram illustrating an electronic device 1001 in a network environment 1000 according to certain embodiments. Referring to FIG. 10, the electronic device 1001 in the network environment 1000 may communicate with an electronic device 1002 via a first network 1098 (e.g., a short-range wireless communication network), or an electronic device 1004 or a server 1008 via a second network 1099 (e.g., a long-range wireless communication network). According to an embodiment, the electronic device 1001 may communicate with the electronic device 1004 via the server 1008. According to an embodiment, the electronic device 1001 may include a processor 1020, memory 1030, an input device 1050, a sound output device 1055, a display device 1060, an audio module 1070, a sensor module 1076, an interface 1077, a haptic module 1079, a camera module 1080, a power management module 1088, a battery 1089, a communication module 1090, a subscriber identification module (SIM) 1096, or an antenna module 1097. In some embodiments, at least one (e.g., the display device 1060 or the camera module 1080) of the components may be omitted from the electronic device 1001, or one or more other components may be added in the electronic device 1001. In some embodiments, some of the components may be implemented as single integrated circuitry. For example, the sensor module 1076 (e.g., a fingerprint sensor, an iris sensor, or an illuminance sensor) may be implemented as embedded in the display device 1060 (e.g., a display).

The processor 1020 may execute, for example, software (e.g., a program 1040) to control at least one other component (e.g., a hardware or software component) of the electronic device 1001 coupled with the processor 1020, and may perform various data processing or computation. According to one embodiment, as at least part of the data processing or computation, the processor 1020 may load a command or data received from another component (e.g., the sensor module 1076 or the communication module 1090) in volatile memory 1032, process the command or the data stored in the volatile memory 1032, and store resulting data in non-volatile memory 1034. According to an embodiment, the processor 1020 may include a main processor 1021 (e.g., a central processing unit (CPU) or an application processor (AP)), and an auxiliary processor 1023 (e.g., a graphics processing unit (GPU), an image signal processor (ISP), a sensor hub processor, or a communication processor (CP)) that is operable independently from, or in conjunction with, the main processor 1021. Additionally or alternatively, the auxiliary processor 1023 may be adapted to consume less power than the main processor 1021, or to be specific to a specified function. The auxiliary processor 1023 may be implemented as separate from, or as part of the main processor 1021.

The auxiliary processor 1023 may control at least some of functions or states related to at least one component (e.g., the display device 1060, the sensor module 1076, or the communication module 1090) among the components of the electronic device 1001, instead of the main processor 1021 while the main processor 1021 is in an inactive (e.g., sleep) state, or together with the main processor 1021 while the main processor 1021 is in an active state (e.g., executing an application). According to an embodiment, the auxiliary processor 1023 (e.g., an image signal processor or a communication processor) may be implemented as part of another component (e.g., the camera module 1080 or the communication module 1090) functionally related to the auxiliary processor 1023. The term "processor" shall be understood to refer to the singular context as well as the plural.

The memory 1030 may store various data used by at least one component (e.g., the processor 1020 or the sensor module 1076) of the electronic device 1001. The various data may include, for example, software (e.g., the program 1040) and input data or output data for a command related thereto. The memory 1030 may include the volatile memory 1032 or the non-volatile memory 1034.

The program 1040 may be stored in the memory 1030 as software, and may include, for example, an operating system (OS) 1042, middleware 1044, or an application 1046.

The input device 1050 may receive a command or data to be used by other component (e.g., the processor 1020) of the electronic device 1001, from the outside (e.g., a user) of the electronic device 1001. The input device 1050 may include, for example, a microphone, a mouse, a keyboard, or a digital pen (e.g., a stylus pen).

The sound output device 1055 may output sound signals to the outside of the electronic device 1001. The sound output device 1055 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 1060 may visually provide information to the outside (e.g., a user) of the electronic device 1001. The display device 1060 may include, for example, a display, a hologram device, or a projector and control circuitry to control a corresponding one of the display, hologram device, and projector. According to an embodiment, the display device 1060 may include touch circuitry adapted to detect a touch, or sensor circuitry (e.g., a pressure sensor) adapted to measure the intensity of force incurred by the touch.

The audio module 1070 may convert a sound into an electrical signal and vice versa. According to an embodiment, the audio module 1070 may obtain the sound via the input device 1050, or output the sound via the sound output device 1055 or a headphone of an external electronic device (e.g., an electronic device 1002) directly (e.g., wiredly) or wirelessly coupled with the electronic device 1001.

The sensor module 1076 may detect an operational state (e.g., power or temperature) of the electronic device 1001 or an environmental state (e.g., a state of a user) external to the electronic device 1001, and then generate an electrical signal or data value corresponding to the detected state. According to an embodiment, the sensor module 1076 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1077 may support one or more specified protocols to be used for the electronic device 1001 to be coupled with the external electronic device (e.g., the electronic device 1002) directly (e.g., wiredly) or wirelessly. According to an embodiment, the interface 1077 may include, for example, a high definition multimedia interface (HDMI), a universal serial bus (USB) interface, a secure digital (SD) card interface, or an audio interface.

A connecting terminal 1078 may include a connector via which the electronic device 1001 may be physically connected with the external electronic device (e.g., the electronic device 1002). According to an embodiment, the connecting terminal 1078 may include, for example, a HDMI connector, a USB connector, a SD card connector, or an audio connector (e.g., a headphone connector).

The haptic module 1079 may convert an electrical signal into a mechanical stimulus (e.g., a vibration or a movement)

or electrical stimulus which may be recognized by a user via his tactile sensation or kinesthetic sensation. According to an embodiment, the haptic module 1079 may include, for example, a motor, a piezoelectric element, or an electric stimulator.

The camera module 1080 may capture a still image or moving images. According to an embodiment, the camera module 1080 may include one or more lenses, image sensors, image signal processors, or flashes.

The power management module 1088 may manage power supplied to the electronic device 1001. According to one embodiment, the power management module 1088 may be implemented as at least part of, for example, a power management integrated circuit (PMIC).

The battery 1089 may supply power to at least one component of the electronic device 1001. According to an embodiment, the battery 1089 may include, for example, a primary cell which is not rechargeable, a secondary cell which is rechargeable, or a fuel cell.

The communication module 1090 may support establishing a direct (e.g., wired) communication channel or a wireless communication channel between the electronic device 1001 and the external electronic device (e.g., the electronic device 1002, the electronic device 1004, or the server 1008) and performing communication via the established communication channel. The communication module 1090 may include one or more communication processors that are operable independently from the processor 1020 (e.g., the application processor (AP)) and supports a direct (e.g., wired) communication or a wireless communication. According to an embodiment, the communication module 1090 may include a wireless communication module 1092 (e.g., a cellular communication module, a short-range wireless communication module, or a global navigation satellite system (GNSS) communication module) or a wired communication module 1094 (e.g., a local area network (LAN) communication module or a power line communication (PLC) module). A corresponding one of these communication modules may communicate with the external electronic device via the first network 1098 (e.g., a short-range communication network, such as Bluetooth™, wireless-fidelity (Wi-Fi) direct, or infrared data association (IrDA)) or the second network 1099 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1092 may identify and authenticate the electronic device 1001 in a communication network, such as the first network 1098 or the second network 1099, using subscriber information (e.g., international mobile subscriber identity (IMSI)) stored in the subscriber identification module 1096.

The antenna module 1097 may transmit or receive a signal or power to or from the outside (e.g., the external electronic device) of the electronic device 1001. According to an embodiment, the antenna module 1097 may include an antenna including a radiating element composed of a conductive material or a conductive pattern formed in or on a substrate (e.g., PCB). According to an embodiment, the antenna module 1097 may include a plurality of antennas. In such a case, at least one antenna appropriate for a communication scheme used in the communication network, such as the first network 1098 or the second network 1099, may be selected, for example, by the communication module 1090 (e.g., the wireless communication module 1092) from the plurality of antennas. The signal or the power may then be transmitted or received between the communication module 1090 and the external electronic device via the selected at least one antenna. According to an embodiment, another component (e.g., a radio frequency integrated circuit (RFIC)) other than the radiating element may be additionally formed as part of the antenna module 1097.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1001 and the external electronic device 1004 via the server 1008 coupled with the second network 1099. Each of the electronic devices 1002 and 1004 may be a device of a same type as, or a different type, from the electronic device 1001. According to an embodiment, all or some of operations to be executed at the electronic device 1001 may be executed at one or more of the external electronic devices 1002, 1004, or 1008. For example, if the electronic device 1001 should perform a function or a service automatically, or in response to a request from a user or another device, the electronic device 1001, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1001. The electronic device 1001 may provide the outcome, with or without further processing of the outcome, as at least part of a reply to the request. To that end, a cloud computing, distributed computing, or client-server computing technology may be used, for example.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 1040) including one or more instructions that are stored in a storage medium (e.g., internal memory 1036 or external memory 1038) that is readable by a machine (e.g., the electronic device 1001). For example, a processor (e.g., the processor 1020) of the machine (e.g., the electronic device 1001) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. An electronic device comprising:
    a housing;
    at least one metal plate disposed inside the housing;
    at least one magnetic force detecting sensor disposed below the at least one metal plate;
    a memory; and
    a processor operatively connected to the at least one magnetic force detecting sensor and the memory,
    wherein the processor is configured to:
    recognize attachment of at least one accessory to a specified region of the housing based on an intensity of a magnetic force and a polarity sensed by the at least one magnetic force detecting sensor, the at least one accessory including at least one magnet inside the at least one accessory; and
    determine an attribute of the attached at least one accessory corresponding to the sensed intensity of the magnetic force and the polarity using information stored in the memory,
    wherein the processor is further configured to: when a plurality of accessories are attached,
    determine the plurality of accessories as a set of accessories based on the polarity and the intensity of the magnetic force of each of the plurality of accessories, and
    determine an attribute of the set of accessories based on the polarity and the intensity of the magnetic force of each of the plurality of accessories.

2. The electronic device of claim 1, wherein the specified region of the housing includes at least one of a groove, and a line.

3. The electronic device of claim 1, wherein the housing and the at least one accessory comprises a silicone material.

4. The electronic device of claim 1, wherein the at least one metal plate is coupled to or adjacent to an inner wall of the housing.

5. The electronic device of claim 1, wherein the at least one magnet is coupled to or adjacent to an inner wall of one region of the at least one accessory in contact with the specified region of the housing.

6. The electronic device of claim 1,
    wherein the set of accessories include at least two accessories having a same quantity, placement position, polarity, and magnetic force strength of the at least one magnet.

7. The electronic device of claim 1, wherein the specified region of the housing includes a plurality of regions,
    wherein the information stored in the memory includes polarity information, magnetic force strength information, and attribute information of each of the plurality of accessories.

8. The electronic device of claim 1, wherein the processor is configured to:
    receive polarity information and the magnetic force strength information of each of the plurality of accessories from the at least one magnetic force detecting sensor; and
    determine the plurality of accessories as the set of accessories when the polarity information and the magnetic force strength information of the plurality of accessories are substantially the same.

9. The electronic device of claim 1, wherein the processor is configured to:

provide a function or a service corresponding to the attribute of the attached at least one accessory or the attribute of the set of accessories.

10. The electronic device of claim 9, further comprising: a display,
wherein provision of the function or service comprises output a user interface corresponding to the attribute of the attached at least one accessory or the attribute of the set of accessories or output a persona corresponding to the attribute of the attached at least one accessory or the attribute of the set of accessories.

11. The electronic device of claim 9, further comprising: at least one speaker,
wherein provision of the function or service comprises output a sound corresponding to the attribute of the attached at least one accessory or the attribute of the set of accessories using the at least one speaker.

12. The electronic device of claim 9, further comprising: a communication circuit,
wherein provision of the function or service comprises compile statistics of the attribute of the attached at least one accessory or the attribute of the set of accessories during a specified period, and download a content from a specified external server using the communication circuit related to accessory attribute information identified in excess of a predetermined number of times.

13. An electronic device comprising:
a housing;
at least one touch sensor disposed inside the housing;
a memory; and
a processor operatively connected to the at least one touch sensor and the memory,
wherein the processor is configured to:
recognize attachment of at least one accessory to a specified region of the housing based on a touch area and a touch intensity sensed by the at least one touch sensor, wherein the at least one accessory comprises a dielectronic disposed inside the at least one accessory; and
determine an attribute of the attached at least one accessory corresponding to the sensed touch area and touch intensity using at least information stored in the memory,
wherein the processor is further configured to: when a plurality of accessories are attached,
determine the plurality of accessories as a set of accessories based on the touch area and the touch intensity of each of the plurality of accessories, and
determine an attribute of the set of accessories based on the touch area and the touch intensity of each of the plurality of accessories.

14. The electronic device of claim 13, wherein the set of accessories include at least two accessories having a same dielectric permittivity and size.

15. The electronic device of claim 13, wherein the processor is configured to:
provide a function or a service corresponding to the attribute of the attached at least one accessory or the attribute of the set of accessories.

* * * * *